US009420708B2

(12) United States Patent
Hibino et al.

(10) Patent No.: US 9,420,708 B2
(45) Date of Patent: Aug. 16, 2016

(54) METHOD FOR MANUFACTURING MULTILAYER PRINTED WIRING BOARD

(75) Inventors: Toshiaki Hibino, Ogaki (JP); Takema Adachi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 1127 days.

(21) Appl. No.: 13/427,231

(22) Filed: Mar. 22, 2012

(65) Prior Publication Data
US 2012/0246924 A1 Oct. 4, 2012

Related U.S. Application Data

(60) Provisional application No. 61/468,941, filed on Mar. 29, 2011.

(51) Int. Cl.
*H01K 3/10* (2006.01)
*H05K 3/46* (2006.01)
*H05K 3/44* (2006.01)
*H01L 23/498* (2006.01)
*H01L 21/48* (2006.01)

(52) U.S. Cl.
CPC ............ *H05K 3/4608* (2013.01); *H01L 21/486* (2013.01); *H01L 23/49827* (2013.01); *H01L 21/4857* (2013.01); *H01L 23/49822* (2013.01); *H01L 2224/16225* (2013.01); *H01L 2924/15311* (2013.01); *H05K 3/445* (2013.01); *H05K 2201/096* (2013.01); *H05K 2201/09827* (2013.01); *H05K 2201/09854* (2013.01); *Y10T 29/49124* (2015.01)

(58) Field of Classification Search
CPC ............ H01L 23/49827; H01L 21/486; H01L 24/49822; H01L 21/4857; H01L 2224/16225; H01L 2924/15311; H05K 3/4608; H05K 3/445; H05K 2201/09827; H05K 2201/09854; H05K 3/4038; Y10T 29/49124

USPC ............ 29/830, 831, 846, 847, 852; 174/255, 174/262, 266; 257/774; 361/720
See application file for complete search history.

(56) References Cited

U.S. PATENT DOCUMENTS

| 4,882,454 | A  | * | 11/1989 | Peterson et al. | ............... 174/266 |
| 6,098,282 | A  | * | 8/2000  | Frankeny et al. | ............... 29/852 |
| 6,499,214 | B2 | * | 12/2002 | Li              | .......... H05K 3/4038 29/830 |
| 7,211,899 | B2 | * | 5/2007  | Taniguchi et al. | ............ 257/774 |
| 7,284,323 | B2 | * | 10/2007 | Cheng           | ............. 29/853 |

FOREIGN PATENT DOCUMENTS

JP        2004-140216        5/2004

OTHER PUBLICATIONS

U.S. Appl. No. 13/430,038, filed Mar. 26, 2012, Hibino et al.

* cited by examiner

*Primary Examiner* — Donghai D Nguyen
(74) *Attorney, Agent, or Firm* — Oblon, McClelland, Maier & Neustadt, L.L.P.

(57) ABSTRACT

A method for manufacturing a printed wiring board includes preparing a core substrate having a metal layer having a first penetrating hole and insulation layers formed on the metal layer such that the metal layer is interposed between the insulation layers, forming in the core substrate a second penetrating hole having a first opening portion aligned with the first penetrating hole on a first-surface side of the core substrate and a second opening portion aligned with the first penetrating hole on a second-surface side of the core substrate, forming a first conductor on a first surface of the core substrate, forming a second conductor on a second surface of the core substrate on the opposite side of the first surface of the core substrate, and filling a conductive material in the second penetrating hole such that a through-hole conductor connecting the first conductor and the second conductor is formed.

20 Claims, 11 Drawing Sheets

(A)

(B)

(C)

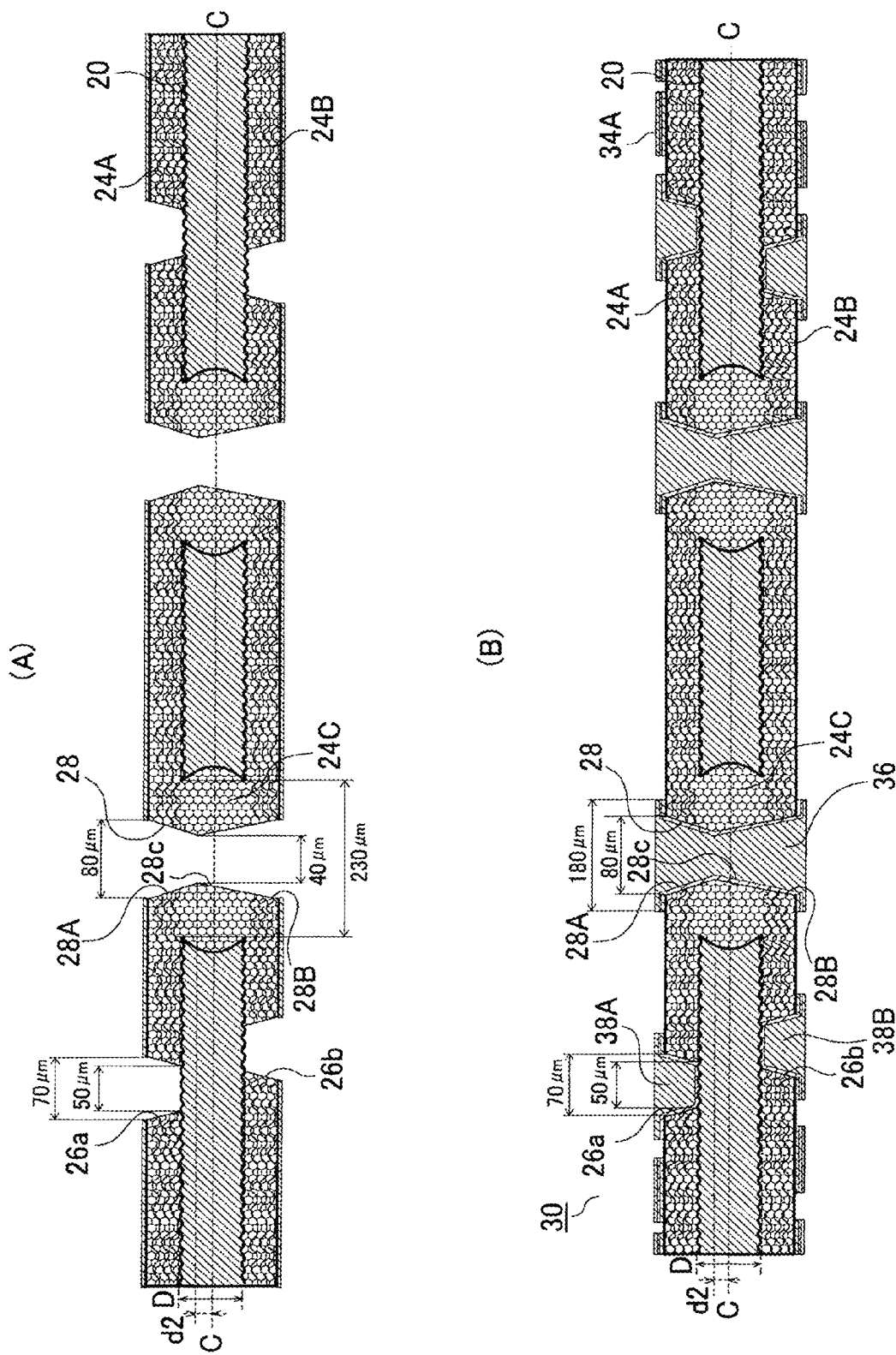

METHOD FOR MANUFACTURING MULTILAYER PRINTED WIRING BOARD

CROSS-REFERENCE TO RELATED APPLICATIONS

The present application is based on and claims the benefit of priority to U.S. Application No. 61/468,941, filed Mar. 29, 2011, the entire contents of which are incorporated herein by reference.

BACKGROUND OF THE INVENTION

1. Field of the Invention

The present invention relates to a printed wiring board having a metal layer with an opening, filler resin formed in the opening of the metal layer, resin insulation layers sandwiching the metal layer, and a through-hole conductor.

2. Discussion of the Background

Japanese Laid-Open Patent Publication 2004-140216 describes a printed wiring board having a metal layer with a penetrating hole. In the penetrating hole of the metal layer, a through-hole conductor in a straight shape is formed and its central portion is filled with resin. The entire contents of this publication are incorporated herein by reference.

SUMMARY OF THE INVENTION

According to one aspect of the present invention, a method for manufacturing a printed wiring board includes preparing a core substrate having a metal layer having a first penetrating hole and insulation layers formed on the metal layer such that the metal layer is interposed between the insulation layers, forming in the core substrate a second penetrating hole having a first opening portion aligned with the first penetrating hole on a first-surface side of the core substrate and a second opening portion aligned with the first penetrating hole on a second-surface side of the core substrate, forming a first conductor on a first surface of the core substrate, forming a second conductor on a second surface of the core substrate on the opposite side of the first surface of the core substrate, and filling a conductive material in the second penetrating hole such that a through-hole conductor connecting the first conductor and the second conductor is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11(A) is a cross-sectional view of another example of a core substrate where penetrating holes are formed, and FIG. 11(B) is a cross-sectional view of the core substrate where through-hole conductors are formed.

DETAILED DESCRIPTION OF THE EMBODIMENTS

Figure 1:
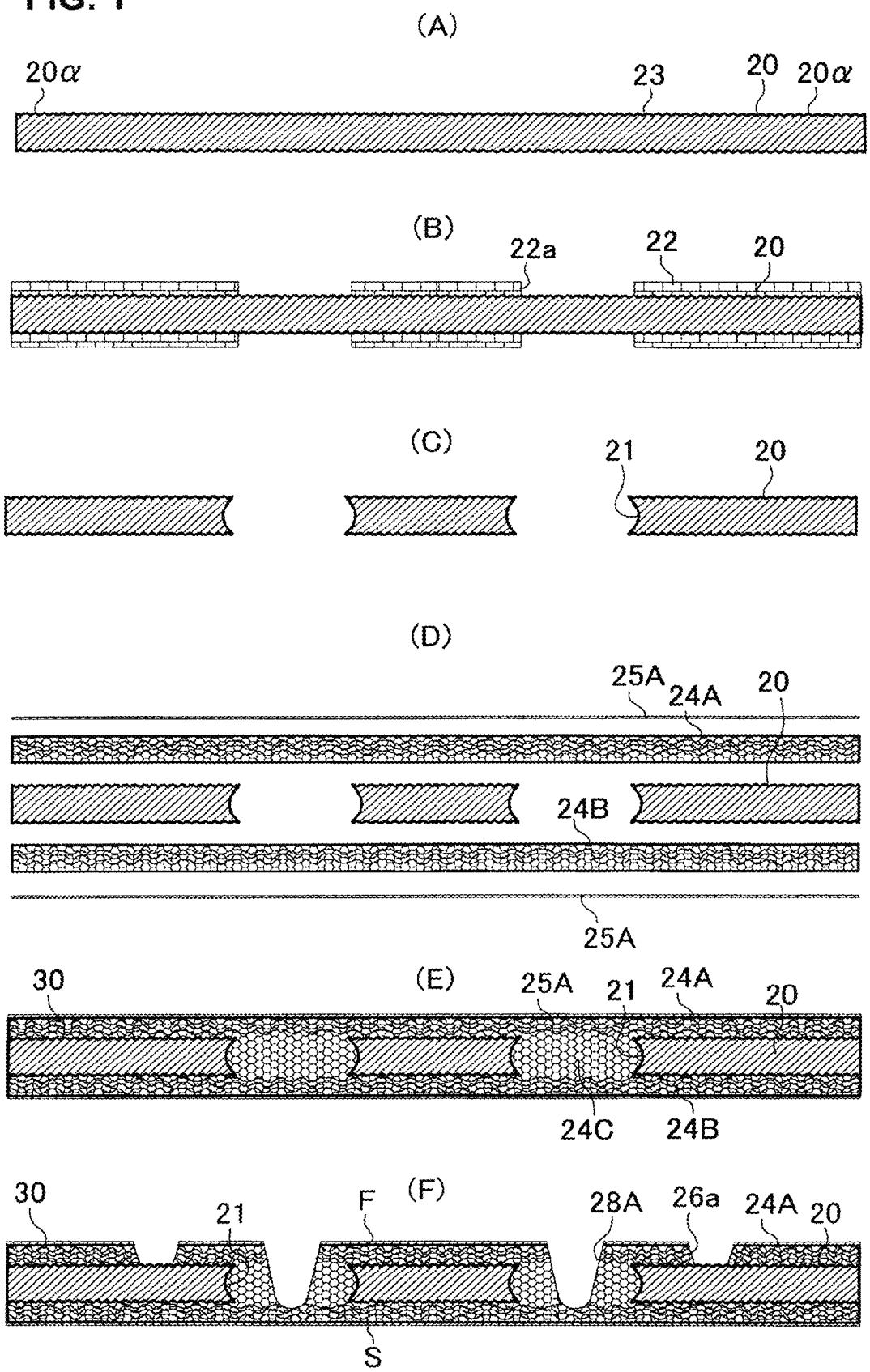
FIGS. 1(A)-1(F) are views showing steps of a method for manufacturing a multilayer printed wiring board according to a first example of the present invention.
Figure 2:
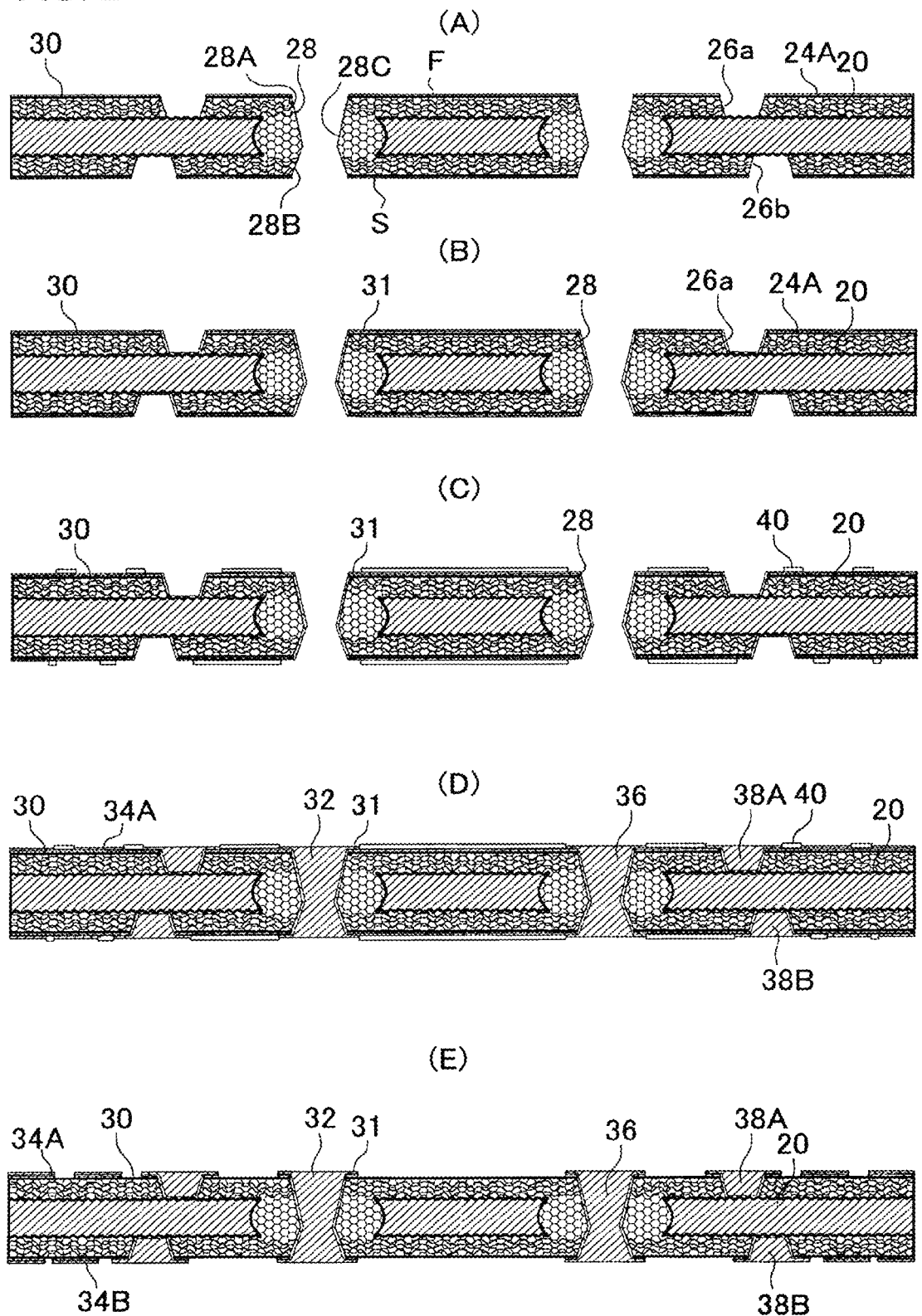
FIGS. 2(A)-2(E) are views showing steps of the method for manufacturing a multilayer printed wiring board according to the first example.
Figure 3:
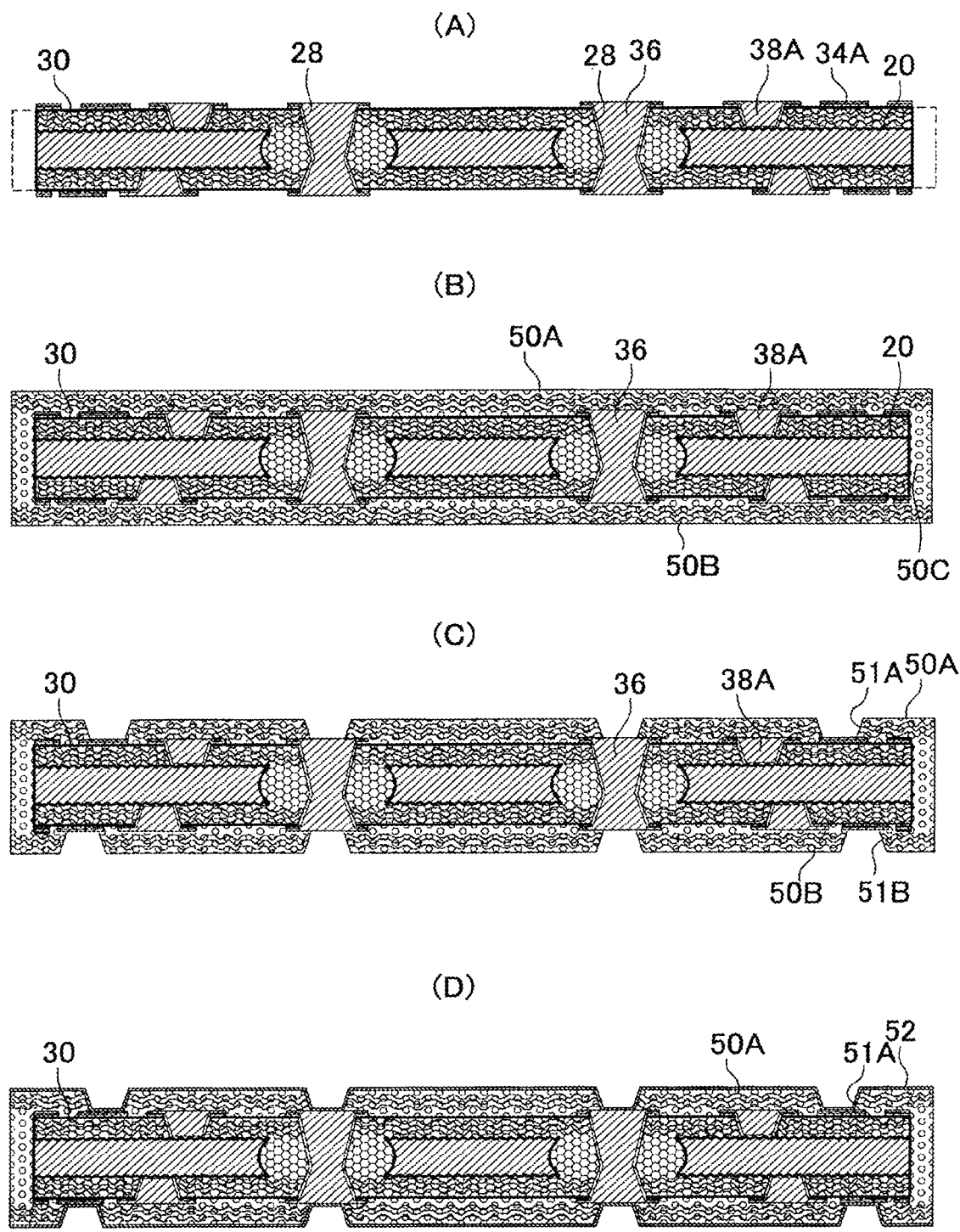
FIGS. 3(A)-3(D) are views showing steps of the method for manufacturing a multilayer printed wiring board according to the first example.
Figure 4:
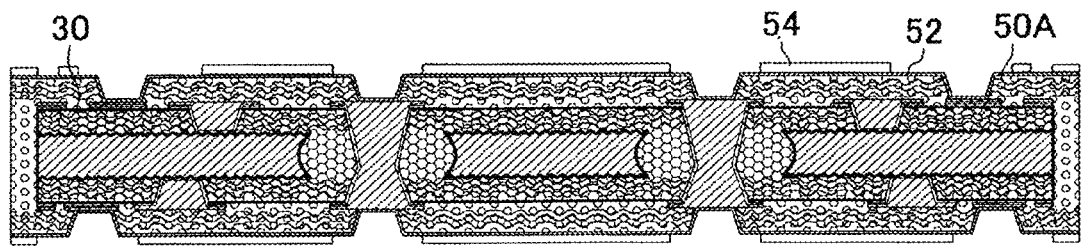
FIGS. 4(A)-4(C) are views showing steps of the method for manufacturing a multilayer printed wiring board according to the first example.
Figure 4:
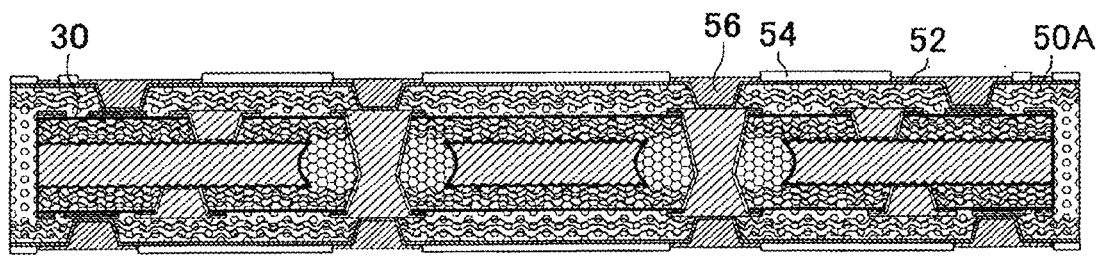
Figure 4:
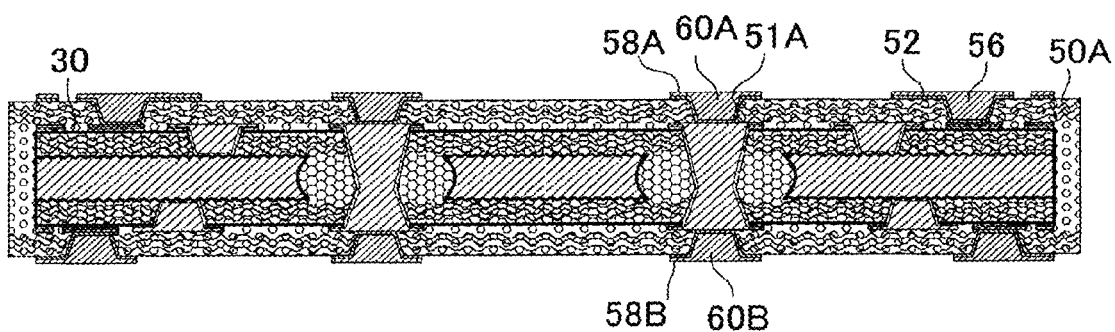
Figure 5:
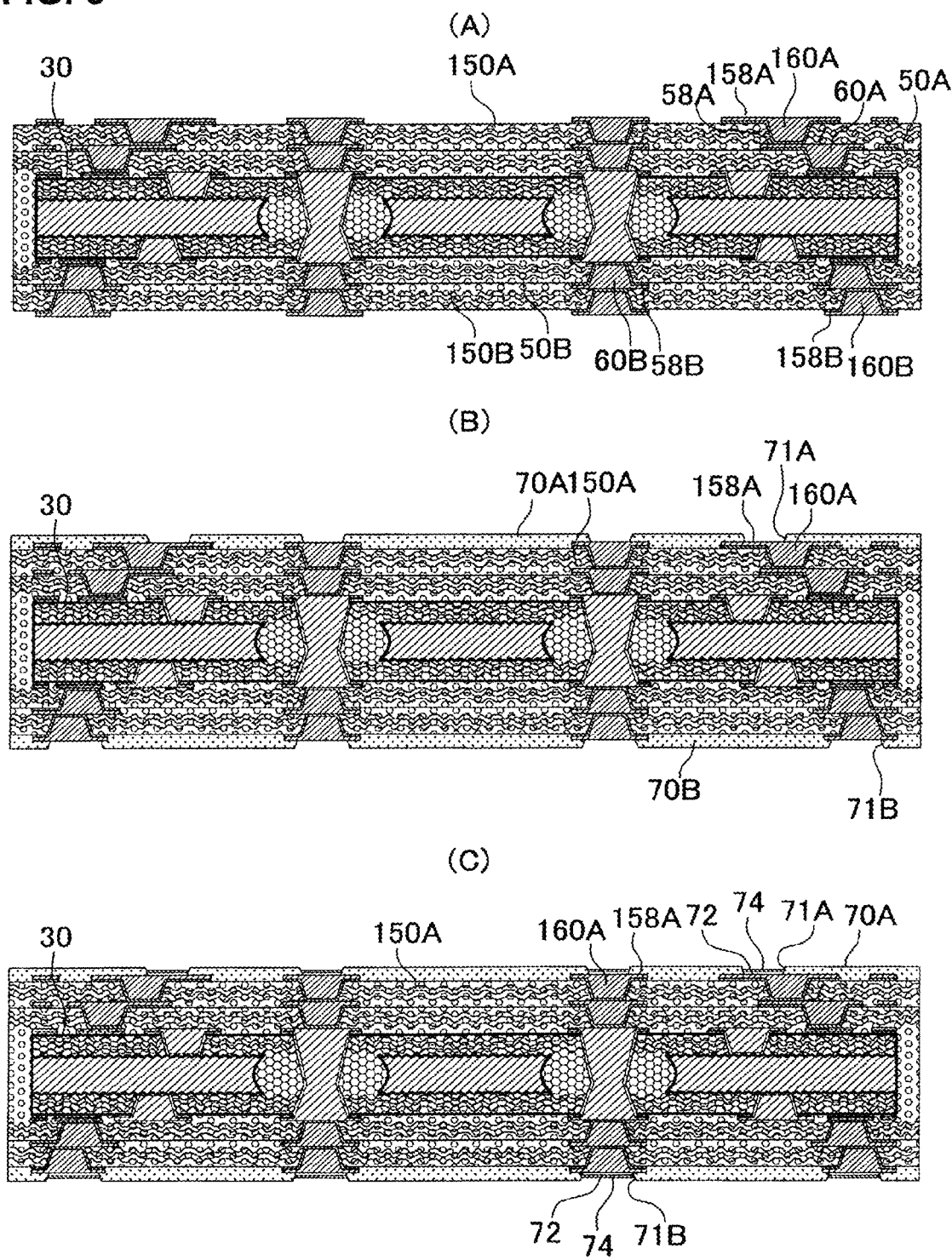
FIGS. 5(A)-5(C) are views showing steps of the method for manufacturing a multilayer printed wiring board according to the first example.

The embodiments will now be described with reference to the accompanying drawings, wherein like reference numerals designate corresponding or identical elements throughout the various drawings.

Figure 6:
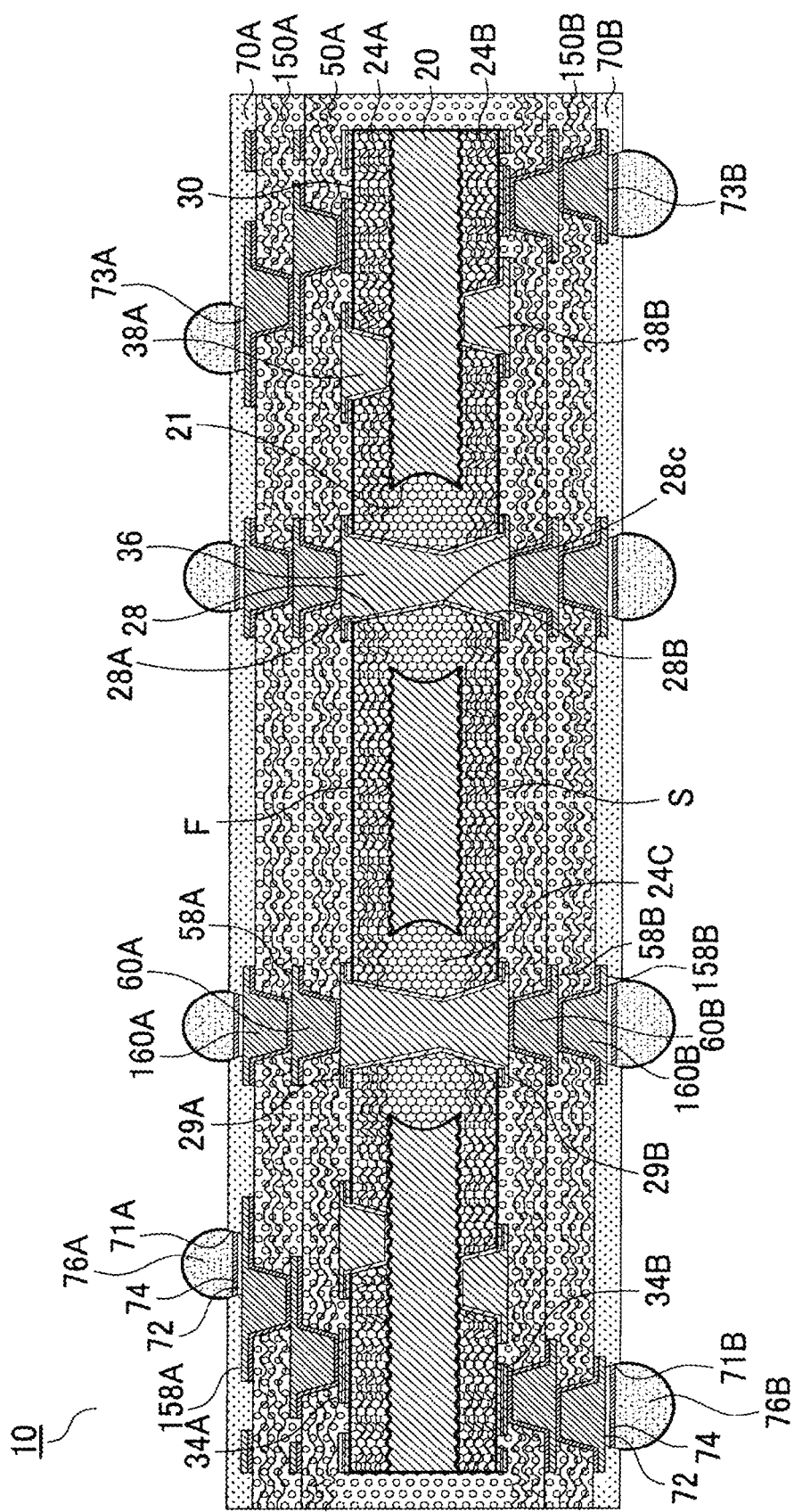
FIG. 6 is a cross-sectional view of a multilayer printed wiring board before an IC chip is mounted.

Multilayer printed wiring board 10 according to the first embodiment is described with reference to FIG. 6. FIG. 6 is a cross-sectional view of multilayer printed wiring board 10. In multilayer printed wiring board 10, first conductive circuit (34A) and first land (29A) are formed on first surface (F) of core substrate 30 which has metal member 20 inside, and second conductive circuit (34B) and second land (29B) are formed on the second surface. First conductive circuit (34A) and second conductive circuit (34B) are connected by through-hole conductor 36. First land (29A) and second land (29B) are connected by through-hole conductor 36.

Upper first interlayer insulation layer (50A) is formed on first surface (F) of core substrate 30 and on first conductive circuit (34A). Upper first interlayer insulation layer (50A) has a first surface and a second surface opposite the first surface. The second surface of upper first interlayer insulation layer (50A) faces the first surface of the core substrate. Conductive circuit (58A) is formed on the first surface of upper first interlayer insulation layer (50A). Conductive circuit (58A) on upper first interlayer insulation layer (50A) is connected to first conductive circuit (34A) or through-hole conductor 36 by via conductor (60A) penetrating through upper first interlayer insulation layer (50A).

Upper second interlayer insulation layer (150A) is formed on the first surface of first interlayer insulation layer (50A). Upper second interlayer insulation layer (150A) has a first surface and a second surface opposite the first surface. The second surface of upper second interlayer insulation layer (150A) faces the first surface of first interlayer insulation layer (50A). Conductive circuit (158A) is formed on the first surface of upper second interlayer insulation layer (150A). Conductive circuit (158A) on upper second interlayer insulation layer (150A) is connected to conductive circuit (58A) or via conductor (60A) by via conductor (160A) penetrating through upper second interlayer insulation layer (150A).

Lower first interlayer insulation layer (50B) is formed on second surface (S) of core substrate 30 and on the second conductive circuit. Lower first interlayer insulation layer (50B) has a first surface and a second surface opposite the first surface. The second surface of lower first interlayer insulation layer (50B) faces the second surface of the core substrate. Conductive circuit (58B) is formed on lower first interlayer insulation layer (50B). Conductive circuit (58B) on lower first interlayer insulation layer (50B) is connected to second conductive circuit (34B) or through-hole conductor 36 by via conductor (60B) penetrating through lower first interlayer insulation layer (503).

Upper second interlayer insulation layer (150B) is formed on the first surface of first interlayer insulation layer (50B). Upper second interlayer insulation layer (150B) has a first surface and a second surface opposite the first surface. The second surface of upper second interlayer insulation layer (150B) faces the first surface of first interlayer insulation layer (50B). Conductive circuit (158B) is formed on the first surface of upper second interlayer insulation layer (150B). Conductive circuit (158B) on upper second interlayer insulation layer (150B) is connected to conductive circuit (58B) or via conductor (60B) by via conductor (160B) penetrating through upper second interlayer resin insulation layer (150B).

Upper solder-resist layer (70A) is formed on the first surface of upper second interlayer insulation layer (150A), and lower solder-resist layer (70B) is formed on the first surface of lower second interlayer insulation layer (150B). Upper and lower solder-resist layers (70A, 70B) have opening portions (71A, 71B) which expose via conductors (160A, 160B) and conductive circuits (158A, 158B). Upper surfaces of the via conductors and conductive circuits exposed through opening portions (71A, 71B) work as solder pads (73A, 73B). Solder bumps (76A, 76B) are formed on solder pads (73A, 73B).

Core substrate 30 in multilayer printed wiring board 10 is formed by laminating insulation layers (24A, 24B) on both surfaces of metal layer 20. Metal layer 20 has first penetrating hole 21 for a through hole, and the first penetrating hole is filled with resin ingredient (24C) that has seeped out at least from either insulation layer (24A) or (24B). The first penetrating hole is formed in an arc shape in a cross-sectional view with the diameter increasing from the upper and lower surfaces of the metal layer toward the center. Conductive circuit (34A) is formed on first surface (F) of core substrate 30, and conductive circuit (34B) is formed on second surface (S). Conductive circuit (34A) on first surface (F) of core substrate 30, and conductive circuit (34B) on second surface (S) are connected by through-hole conductor 36. Also, metal layer 20 and conductive circuits 34 are connected by via conductor (38A) penetrating through insulation layer (24A) and by via conductor (38B) penetrating through insulation layer (24B).

Through-hole conductor 36 is formed by filling copper plating in second penetrating hole 28 which is formed in insulation layers (24A, 24B) of the core substrate and filled-resin portion (24C) in first penetrating hole 21. Second penetrating hole 28 is made up of first opening portion (28A) formed in insulation layer (24A) on the first-surface (F) side of core substrate 30, second opening portion (28B) formed in insulation layer (24B) on the second-surface (F) side, and fifth opening portion (28C) formed in filled-resin portion (24C). First opening portion (28A) is formed by irradiating a laser at the first surface from the first-surface (F) side of core substrate 30 toward the second surface. Second opening portion (28B) is formed by irradiating a laser at the second surface from the second-surface (S) side of core substrate 30 toward the first surface. First opening portion (28A) tapers from the first surface toward the second surface, while second opening portion (28B) tapers from the second surface toward the first surface, and first opening portion (28A) and second opening portion (28B) are connected at juncture (28c) in filled-resin portion (24C) in the first penetrating hole.

Since first penetrating hole 21 is filled only with resin ingredient (24C) that has seeped out from insulation layers (24A, 24B), cracking seldom occurs on the inner wall of second penetrating hole 28 (fifth opening portion 28C) in filled-resin portion (24C). Accordingly, during a step in which copper plating is filled in second penetrating hole 28, the plating solution does not seep out from the inner wall of penetrating hole 28 in the first penetrating hole, and short circuiting is unlikely to occur between metal layer 20 and through-hole conductor 36.

Figure 8:
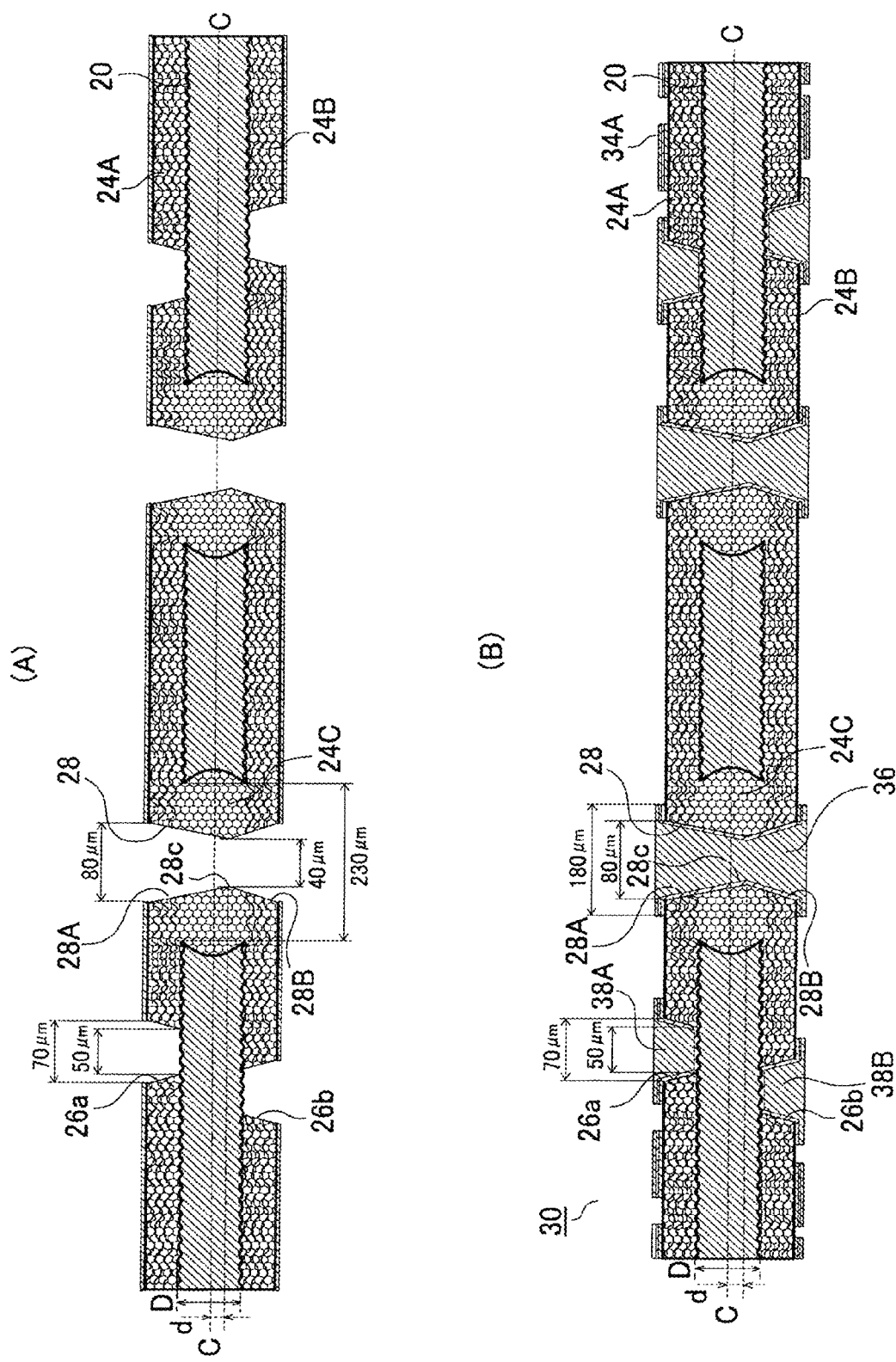
FIG. 8(A) is a cross-sectional view of a core substrate where penetrating holes are formed.
FIG. 8(B) is a cross-sectional view of the core substrate where through-hole conductors are formed.

Juncture (28c) is formed in filled-resin portion (24C) in the first penetrating hole. Juncture (28c) is not always required to be positioned in the center of metal layer 20 in a thickness direction (FIG. 8(A) (B)). FIG. 8(B) shows insulation layer (24A), metal layer 20 and insulation layer (24B) in FIG. 6. Above-described juncture (28c) between first opening portion (28A) and second opening portion (28B) is shifted from the center of core substrate 30 toward the second-surface (S) side by difference (d) from a horizontal line (CC) passing through the center of the metal layer in a thickness direction. In FIG. 8(B), the juncture is shifted from the center of core substrate 30 toward the second-surface (S) side, but it may be shifted from the center of core substrate 30 toward the first-surface (F) side. However, juncture (28c) is located in first penetrating hole 21, and it is not located either in insulation layer (24A) or insulation layer (24B).

Regarding through-hole conductor 36 formed by filling second penetrating hole 28 with plating, the diameter of the through-hole conductor reaches its maximum on first surface (F) and second surface (S) of core substrate 30, and the diameter of the through-hole conductor decreases toward the center of core substrate 30. The diameter of the through-hole conductor reaches its minimum at juncture (28c) in filled-resin portion (24C) in the first penetrating hole.

Through-hole conductor 36 penetrates through filled-resin portion (24C) of first penetrating hole 21, insulation layer (24A) and insulation layer (24B), and tapers respectively from the first surface and the second surface of core substrate 30 toward the center of core substrate 30, being connected where the diameter of filled-resin portion (24C) reaches its minimum in first penetrating hole 21. In the above core substrate 30, the difference in thermal expansion coefficients is great at contact portions between insulation layers (24A, 24B), which are made of inorganic fiber such as glass fiber and resin ingredients, and through-hole conductor 36 filled with copper plating. By contrast, since the first penetrating hole in metal layer 20 is filled only with resin (24C) and has juncture (28c) which reduces the volume of through-hole conductor 36, the difference in thermal expansion coefficients is smaller than in the above contact portions. Moreover, the first penetrating hole in metal layer 20 is formed in an arc shape in a cross-sectional view so that the diameter increases from the upper and lower surfaces of the metal layer toward the center. Therefore, in the first embodiment, thermal stress generated at contact portions between insulation layers (24A, 24B) and through-hole conductor 36 can be released to the first penetrating hole. Accordingly, warping caused by thermal stress is suppressed, and that short circuiting between the metal layer and the through-hole conductor caused by cracking in resin during heat cycles or the like is suppressed.

Metal layer 20 of core substrate 30 is used as a power-source conductor, and via conductors (38A, 38B) connected to metal layer 20 are used as power-source conductors. On the other hand, through-hole conductor 36 is used as a signal conductor. In the present embodiment, metal layer 20 is used as a power-source conductor, but it may also be used as a ground conductor.

Figure 10:
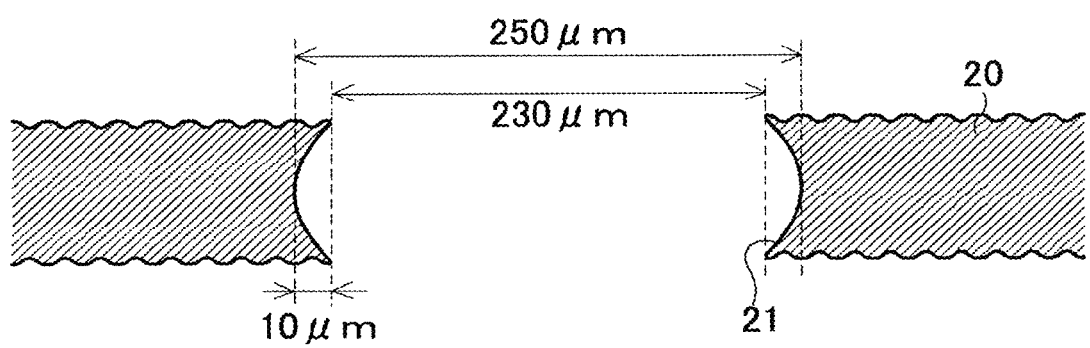
FIG. 10 is a view to illustrate a first penetrating hole.

In the first embodiment, through-hole conductor 36 formed by filling metal plating tapers from the first-surface (F) side of core substrate 30 toward the second-surface (S) side, while tapering from the second-surface (S) side toward the first-surface (F) side, being connected at juncture (28c) in filled-resin portion (24C) in the first penetrating hole. The diameter of through-hole conductor 36 reaches its minimum at juncture (28c). The inner wall of the first penetrating hole in metal layer 20 of core substrate 30 is formed in an arc shape in a cross-sectional view with the diameter increasing from the upper and lower surfaces of the metal layer toward the center. The distance between metal layer 20 and through-hole conductor 36 is greatest when metal layer 20 and through-hole conductor 36 are formed as above. FIG. 8(A), (B) and FIG. 10 show the opening diameter of the first penetrating hole in the metal layer set at 230 μm, the recessed amount of the inner wall at 10 μm, the maximum diameter of through-hole conductor 36 at 80 μm, and its minimum diameter at 40 μm. If the inner wall of metal layer 20 is not recessed but has a straight shape, and through-hole conductor 36 is in a column shape and its cross section has a straight shape, the distance between metal layer 20 and through-hole conductor 36 is smallest, and the difference from the first embodiment is 30 μm. The distance between metal layer 20 and through-hole conductor 36 is greatest when the structure is formed according to the first embodiment. By contrast, the distance between metal layer 20 and through-hole conductor 36 is smallest when the structure is formed according to a conventional art.

Metal layer 20 is used as a power-source conductor in the first embodiment, while through-hole conductor 36 is used as a signal conductor. When a power-source conductor is set close to a signal conductor, noise becomes an issue. Thus, the distance is preferred to be great between through-hole conductor 36 and metal layer 20. Since the distance between a signal conductor and a power-source conductor is set greater in the first embodiment than in conventional art, impact from noise is reduced.

Next, a method for manufacturing multilayer printed wiring board 10 described above by referring to FIG. 6 is described with reference to FIGS. 1~6.

(1) A 35 μm-thick metal layer is prepared, made of copper with the surface roughness Rz of a first surface set at 4.5 μm, and the surface roughness Rz of its opposite second surface set at 2.5 μm (FIG. 1(A)). The metal layer is preferred to be an Fe—Ni alloy such as 42 alloy instead of copper, because such an alloy is excellent in thermal conduction and its electrical resistance is close to that of copper.

(2) As shown in FIG. 1(B), etching resists 22 are formed on first surface (F) and second surface (S) of metal layer 20 to form first penetrating hole 21 for a through hole in metal layer 20. Opening portions (22a) in the etching-resist films on the first surface and second surface of metal layer 20 are formed to be aligned in the same location sandwiching metal layer 20.

(3) By etching away metal layer 20 exposed through opening portions (22a) under the same conditions, metal layer 20 is formed to have multiple first penetrating holes 21 for through holes (FIG. 1(C)). At that time, first penetrating hole 21 for a through hole is formed in an arc shape in a cross-sectional view with its diameter increasing from the first-surface side and the second-surface side of metal layer 20 toward the center. By etching, first penetrating hole 21 for a through hole is formed to have an opening diameter of 230 μm, which increases toward the center by 10 μm to reach its maximum diameter of 250 μm. The amount of etching is preferred to be in a range of 1~ μm. If the amount is 1 μm or less, the effect of mitigating stress is not expected. If the amount is 12 μm or greater, resin may not be completely filled, resulting in a void. Metal layer 20 having first penetrating holes 21 for through holes and connectors that connect multiple metal layers 20 are also formed at the same time that penetrating holes 21 for through holes are formed. After penetrating holes 21 for through holes are formed, the etching-resist films are removed and a coupling agent is applied to the first and second surfaces of metal layer 20 to improve adhesiveness with insulation layers.

(4) On the first surface and the second surface of metal layer 20, first insulation layer (24A) and second insulation layer (24B) with copper foils (25A, 25B) are formed (FIG. 1(D)). The layer thickness of first insulation layer (24A) and second insulation layer (24B) is 50 μm. The layer thickness of copper foils (25A, 25B) is 5 μm. Insulation layers are made of core material of inorganic fiber or the like such as glass cloth impregnated with resin. Insulation layers may include inorganic filler such as silica or alumina. When first insulation layer (24A) and second insulation layer (24B) with copper foils are formed on the first surface and the second surface of metal layer 20, there are two options such as follows: single-sided copper-clad first insulation layer (24A) and second insulation layer (24B) are laminated respectively on the first surface and the second surface of metal layer 20; or first insulation layer (24A) and copper foil (25A) as well as second insulation layer (24B) and copper foil (25B) are simultaneously laminated on the first surface and the second surface of metal layer 20 respectively. Either process may be employed. During the lamination, resin material (24C) that seeps out from at least either first insulation layer (24A) or second insulation layer (24B) is filled in first penetrating hole 21 formed in metal layer 20 (FIG. 1(E)).

After copper foils (25A, 25B) are laminated on surfaces of first insulation layer (24A) and second insulation layer (24B), a black-oxide treatment is conducted on their surfaces (not shown in the drawings). Laser absorption is required to be improved for laser processing to form penetrating holes for through holes.

(5) From the first surface of core substrate 30 toward the second surface, a $CO_2$ gas laser is irradiated at the first surface (copper foil 25A) to be aligned with the position of first penetrating hole 21. Accordingly, first opening portion (28A) penetrating through at least first insulation layer (24A) is formed on the first-surface side of core substrate 30. The number of shots at this time is one. The opening diameter of first opening (28A) is 80 μm. However, the pulse width and the number of shots when irradiating a laser are not limited specifically. The aperture diameter is set smaller than the opening diameter of first penetrating hole 21. By irradiating a $CO_2$ gas laser on the first surface from the first surface of core substrate 30 toward the second surface, third via opening portion (26a) penetrating through first insulation layer (24A) is formed on the first surface of metal member 20 (FIG. 1(F)). The number of shots at this time is one. The opening diameter of third via opening portion (26a) is 75 μm. However, the pulse width and the number of shots when irradiating a laser are not limited specifically. First opening portion (28A) and third via opening portion (26a) are formed consecutively.

(6) From the second surface of core substrate 30 toward the first surface, a $CO_2$ gas laser is irradiated at the second surface (copper foil 25B) to be aligned with the position of first penetrating hole 21. Accordingly, second opening portion (28B) penetrating through at least second insulation layer (24B) is formed on the second-surface side of core substrate 30. The number of shots at this time is one. The opening diameter of second opening (28B) is 80 μm. However, the pulse width and the number of shots when irradiating a laser are not limited specifically. The aperture diameter is set smaller than the opening diameter of first penetrating hole 21. By irradiating a $CO_2$ gas laser on the first surface from the second surface of core substrate 30 toward the first surface, fourth via opening portion (26b) penetrating through second insulation layer (24B) is formed on the second surface of metal layer 20 (FIG. 1(F)). The number of shots at this time is one. The opening diameter of fourth via opening portion (26b) is 75 μm. However, the pulse width and the number of shots when irradiating a laser are not limited specifically. Second opening portion (28B) and third via opening portion (26b) are formed consecutively.

In the first embodiment, a shot of CO2 gas laser is irradiated from the first surface toward the second surface of core substrate 30, and a shot of CO2 gas laser is irradiated from the second surface toward the first surface of core substrate 30. By irradiating a total of two shots of CO2 gas laser, a second penetrating hole for a through hole is formed. As a result, since second penetrating hole 28 with a small diameter is formed in first penetrating hole 21 in metal layer 20, metal layer 20 and through-hole conductor 36 are securely insulated. In the present embodiment, by irradiating two shots of CO2 gas laser, a required taper shape is achieved where a plating solution easily flows.

Penetrating hole 28 is formed by first opening portion (28A) and second opening portion (28B). First opening portion (28A) is an opening portion that penetrates through first insulation layer (24A), and second opening portion (28B) is an opening portion that penetrates through second insulation layer (24B), and fifth opening portion (28C) is an opening portion that penetrates through filled-resin portion (24C). Second penetrating hole 28 is formed by first opening portion (28A) and second opening portion (28B) connected in fifth opening portion (28C). First opening portion (28A) tapers from the first-surface (F) side of core substrate 30 toward second surface (S). Second opening portion (28B) tapers from the second-surface (S) side of core substrate 30 toward first surface (F). The diameter of second penetrating hole 28 decreases as it goes toward the center of core substrate 30 and its minimum diameter is 40 μm. The minimum diameter of second penetrating hole 28 corresponds to the minimum diameter of fifth opening portion (28C). Regarding the location where the diameter of second penetrating hole 28 reaches its minimum in core substrate 30, the distance from the first surface of the metal layer in a depth direction may be the same as or different from the distance from the second surface in a depth direction in fifth opening portion (28C).

FIG. 8(A) (B) show when the distance in a depth direction of the core substrate is different on the first-surface side and the second-surface side. In the first embodiment, second penetrating hole 28 for a through hole is formed with first opening portion (28A) and second opening portion (28B) which become gradually narrower toward the center of core substrate 30. Then, juncture (28c) between the first opening portion and the second opening portion is shifted by difference (d) from the central location (C-C) of metal layer 20 in a thickness direction toward the second-surface side. In the first embodiment, when a first opening portion is formed from the first-surface side and when a second opening portion is formed from the second-surface side, the aperture diameter of a laser is set the same. Then, the laser pulse width when the first opening portion is formed from the first-surface side is set greater than the laser pulse width when the second opening portion is formed on the second-surface side. Under such laser conditions, the first opening portion is formed from the first-surface side toward the second surface beyond the central location of the core substrate in a thickness direction (FIG. 1(F)). Next, when the second opening portion is formed by a laser from the second-surface side, since the first opening portion has already reached near the second surface, juncture (28c) is formed without increasing the pulse width. At that time, juncture (28c) is shifted by (d) from the central location (C-C) of metal layer 20 in a thickness direction toward the second-surface side (FIG. 8(A), (B)). In another embodiment shown in FIG. 11(A), (B), the aperture diameter of a laser is set the same when a first opening portion is formed from the first-surface side and when a second opening portion is formed from the second-surface side. Then, the laser pulse width for forming the first opening portion from the first-surface side is set smaller than the laser pulse width for forming the second opening portion from the second-surface side. Under such laser conditions, the first opening portion from the first-surface side is formed shallower than the central location of the core substrate in a thickness direction. Next, when the second opening portion is formed by a laser from the second-surface side, since the first opening portion is formed shallow from the first-surface side shy of reaching the central location of the core substrate in a thickness direction, juncture (28c) is formed by increasing the pulse width to form the second opening portion. At that time, juncture (28c) is shifted by (d2) from the central location (C-C) of metal layer 20 in a thickness direction toward the first-surface side. The location of juncture (28c) is determined by adjusting the pulse widths and aperture diameters of a laser.

When second penetrating hole 28 for a through hole is filled with plating in the first embodiment, the plating solution tends to enter second penetrating hole 28 for a through hole from the first-opening portion (28A) side and to exit from the second-opening portion (28B) side. Therefore, the first opening portion with a greater volume and the second opening portion with a smaller volume are filled with plated film without causing voids. Accordingly, the reliability of through-hole conductor 36 is enhanced in the first embodiment.

Figure 9:
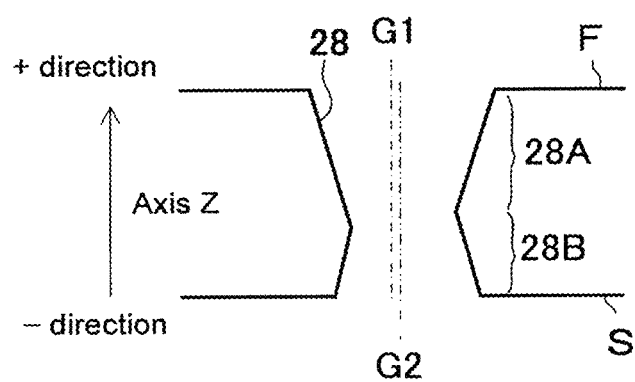
FIG. 9 is a view to illustrate a second penetrating hole.

A straight line passing through the gravity center of first opening portion (28A) and perpendicular to the first surface of the core substrate may be offset from a straight line passing through the gravity center of second opening portion (28B) and perpendicular to the second surface of the core substrate (FIG. 9). If first opening portion (28A) and second opening portion (28B) are connected at fifth opening portion (28C) while being offset from each other, the surface area of the inner walls of second penetrating hole 28 becomes greater than otherwise, thus adhesiveness is improved between through-hole conductor 36, insulation layers and resin material.

In the first embodiment, through-hole conductor 36 made by filling metal plating tapers from first surface (F) (upper surface) of core substrate 30 toward the second-surface (S) (lower surface) side, while also tapering from the second surface toward the first-surface side. Then, the diameter of through-hole conductor 36 reaches its minimum in fifth opening portion (28C). At that time, since the distance reaches its maximum between through-hole conductor 36 as a signal conductor and metal member 20 as a power-source conductor, the impact from noise decreases. Regarding the location where the diameter of through-hole conductor 36 reaches its minimum in fifth opening portion (28C), the distance from the first surface in a depth direction may be the same as or different from the distance from the second surface in a depth direction.

FIG. 8(A) is a magnified view of core substrate 30 with penetrating hole 28. As described above, the reasons that tapering angles decrease in the center of penetrating hole 28 are as follows: Since resin layers (24A, 24B) have glass fibers on upper-layer sides of metal layer 20 and glass fibers are hard to process by a laser, the diameter decreases along the laser incident direction; by contrast, since opening 21 in metal layer 20 does not contain glass fibers and is filled with resin (24C) that has seeped out from glass fibers, it is easier to process by a laser and the diameter does not decrease much along the incident direction.

(7) Electroless plating is performed to form electroless plated film 31 on the following: the surfaces of core substrate 30 where second penetrating hole 28 for a through hole, third opening portion (26a) and fourth opening portion (26b) are formed; the inner wall of second penetrating hole 28; and the inner walls of third opening portion (26a) and fourth opening portion (26b) (FIG. 2(B)).

(8) Photosensitive dry film is laminated on copper foils where electroless plated film is formed, exposed to light and developed. Accordingly, plating resist 40 with a predetermined pattern is formed (FIG. 2(C)).

(9) Electrolytic plating is performed to form electrolytic film 32 where plating resist 40 is not formed. Accordingly, conductive circuits 34, through-hole conductor 36 formed by filling penetrating hole 28 with plating, and via conductors (38A, 38B) formed by filling third opening portion (26a) and fourth opening portion (26b) with plating are formed (FIG. 2(D)).

(10) Plating resist 40 is removed, electroless plated film 31 and copper foils (25A, 25B) under plating resist 40 are etched away, conductive circuits (34A, 34B), through-hole conductor 36 and via conductors (38A, 38B) are formed, and core substrate 30 is completed (FIG. 2(E)). The layer thickness of conductive circuits (34A, 34B) is 15 μm.

(11) A drill is used to cut connectors that connect metal layers 20 (FIG. 3(A)).

(12) On both surfaces of core substrate 30 after the above procedures, first interlayer insulation layer (50A) and second interlayer insulation layer (50B) are formed (see FIG. 3(B)). The layer thicknesses of first interlayer insulation layer (50A) and second interlayer insulation layer (50B) are each 50 μm. At that time, resin (50C), which has seeped out at least from first interlayer insulation layer (50A) or second interlayer insulation layer (50B), is filled in cut holes of the connectors formed by a drill.

(13) Via hole openings (51A, 51B) with a diameter of 75 μm are formed in interlayer insulation layers (50A, 50B) using a CO2 gas laser (see FIG. 3(C)). By immersion in an oxidation agent or the like such as chromic acid and permanganate, surfaces of interlayer insulation layers (50A, 50B) are roughened (not shown in the drawings).

(14) By attaching a catalyst such as palladium on surface layers of interlayer insulation layers (50A, 50B) in advance, and then by immersion in an electroless plating solution for 5~60 minutes, electroless plated film 52 is formed in a range of 0.1~5 μm (FIG. 3(D)).

(15) Photosensitive dry film is laminated on substrate 30 after the above procedure, exposed to light and developed. Accordingly, plating resist 54 with a predetermined pattern is formed (FIG. 4(A)).

(16) Electrolytic plating is performed where the plating resist is not formed so that electrolytic plated film 56 is formed (see FIG. 4(B)).

(17) After plating resist 54 is removed by 5% NaOH, electroless plated film 52 under the plating resist is dissolved and removed by etching using a mixed solution of nitric acid, sulfuric acid and hydrogen peroxide, forming conductive circuits (58A, 58B) and via conductors (60A, 60B) made of electroless plated film 52 and electrolytic plated film 56 (FIG. 4(C)). Surfaces of conductive circuits (58A, 58B) and via conductors (60A, 60B) are roughened by an etching solution containing copper (II) complex and organic acid (not shown in the drawings).

(18) Through the same procedures as in the above (12)~(17), interlayer insulation layers (150A, 150B) having conductive circuits (158A, 158B) and via conductors (160A, 160B) are formed (FIG. 5(A)).

(19) A commercially available solder-resist composition is applied, exposed to light and developed to form solder-resist layers (70A, 70B) having opening portions (71A, 71B) (FIG. 5(B)). The layer thickness of solder-resist layers (70A, 70B) is 15 μm.

(20) The substrate is immersed in an electroless nickel plating solution to form 5 μm-thick nickel-plated layer 72 in opening portions (71A, 71B). In addition, the substrate is immersed in an electroless gold-plating solution to form 0.03 μm-thick gold-plated layer 74 on nickel-plated layer 72 (FIG. 5(C)). Instead of nickel-gold layers, nickel-palladium-gold layers may be formed.

(21) Next, solder balls are loaded in opening portions (71A) and a reflow is conducted. Accordingly, solder bump (76A) is formed on the first-surface (upper-surface) side, and solder bump (76B) is formed on the second-surface (lower-surface) side to complete printed wiring board 10 (FIG. 6).

Figure 7:
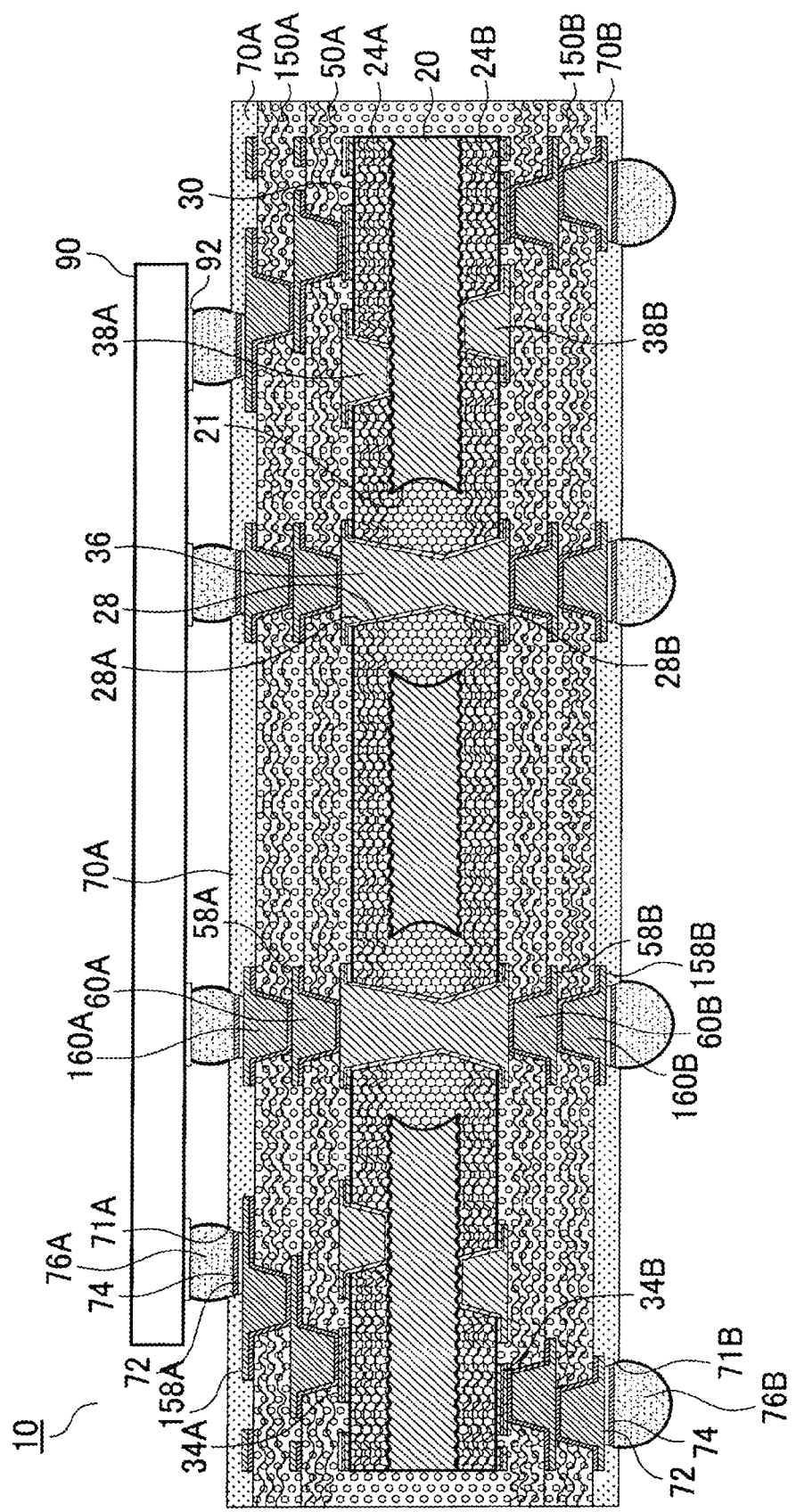
FIG. 7 is a cross-sectional view showing a state where an IC chip is mounted on the multilayer printed wiring board shown in FIG. 6.

IC chip 90 is mounted on printed wiring board 10 by connecting pad 92 of IC chip 90 with solder bump (76A) (FIG. 7).

By using a laser to form through holes, small-diameter through holes are formed with enhanced productivity in penetrating holes of the metal layer.

In a printed wiring board according to the embodiment, juncture (28c) is preferred to be shifted by a predetermined distance from the central location (CC) of metal layer 20. When the thickness of a metal layer is set as (D), shifted amount (d) is preferred to be less than D/2. A through-hole conductor in the embodiment has a bent portion at juncture (28c) between the first opening portion and the second opening portion, and the bent portion does not correspond to the central location of the metal layer. Therefore, the volume of the through-hole conductor from horizontal line (CC) to the first surface of the core substrate tends to be different from the volume of the through-hole conductor from horizontal line (CC) to the second surface of the core substrate. As the difference in the volumes grows greater, the printed wiring board tends to warp more. As the warping becomes greater, the more stress is exerted on the bent portion of the through-hole conductor. Therefore, shifted amount (d) is preferred to be less than D/2 in a printed wiring board of the embodiment.

On the other hand, shifted amount (d) at juncture (28c) is preferred to be D/8 or greater. When temperature rises in a printed wiring board of the embodiment, the filled resin presses against the juncture. To reduce such pressing force, shifted amount (d) is preferred to be D/8 or greater.

The diameter of a through-hole conductor of the embodiment is small where it passes through the metal layer. Therefore, the volume of the metal layer is increased. Accordingly, heat dissipation is excellent in the printed wiring board of the embodiment. With excellent heat dissipation, since the expanding amount by heat decreases, the through-hole conductor is less likely to be deformed. Therefore, although a through-hole conductor in a printed wiring board of the embodiment has a narrowed portion, cracking seldom occurs in the through-hole conductor. In a printed wiring board according to the embodiment, the diameter of a penetrating hole for a through-hole conductor is set larger at the end portions, and smaller around the center of the core substrate. Therefore, filling the penetrating hole with plating is easier, and voids or the like seldom remain in the through-hole conductor. From such viewpoints as well, reliability is enhanced in through-hole conductors of the embodiment.

A method for manufacturing a printed wiring board according to an embodiment of the present invention has the following technological features: preparing a core substrate which has a first surface and a second surface opposite the first surface and which is made up of a metal layer having a first penetrating hole and of insulation layers formed on both surfaces of the metal layer; forming a second penetrating hole in the core substrate by forming a first opening portion to be aligned with the position of the first penetrating hole using a laser from the first-surface side of the core substrate, and by forming a second opening portion to be aligned with the position of the first penetrating hole using a laser from the second-surface side of the core substrate; forming a first conductor on the first surface of the core substrate; forming a second conductor on the second surface of the core substrate; and by filling conductive material in the second penetrating hole, forming a through-hole conductor to connect the first conductor and the second conductor.

According to the embodiment of the present invention above, through-hole conductors are formed with enhanced productivity in penetrating holes in a metal layer.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    preparing a core substrate comprising a metal layer having a first penetrating hole and a plurality of insulation layers formed on the metal layer such that the metal layer is interposed between the insulation layers;
    forming in the core substrate a second penetrating hole having a first opening portion aligned with the first penetrating hole on a first-surface side of the core substrate and a second opening portion aligned with the first penetrating hole on a second-surface side of the core substrate;
    forming a first conductor on a first surface of the core substrate;
    forming a second conductor on a second surface of the core substrate on an opposite side of the first surface of the core substrate; and
    filling a conductive material in the second penetrating hole such that a through-hole conductor connecting the first conductor and the second conductor is formed,
    wherein the first penetrating hole of the metal layer has an inner wall such that the first penetrating hole has a diameter which becomes greater toward a center portion of the metal layer in a thickness direction of the metal layer, the forming of the second penetrating hole comprises setting a straight line passing through a gravity center of the first opening portion and perpendicular to the first surface or second surface of the core substrate off a straight line passing through a gravity center of the second opening portion and perpendicular to the first surface or second surface of the core substrate such that the straight line with respect to passing through the gravity center of the first opening portion is not aligned with the straight line passing through the gravity center of the second opening portion, and the forming of the second penetrating hole comprises forming a juncture portion of the first opening portion and the second opening portion shifted to one of the first-surface side and the second-surface side from a center portion of the metal layer in a thickness direction of the metal layer.

2. The method for manufacturing a multilayer printed wiring board according to claim 1, wherein the forming of the second penetrating hole in the core substrate comprises irradiating laser from the first-surface side of the core substrate such that the first opening portion is aligned with the first penetrating hole and irradiating laser from the second-surface side of the core substrate such that the second opening portion is aligned with the first penetrating hole.

3. The method for manufacturing a multilayer printed wiring board according to claim 2, wherein the forming of the second penetrating hole comprises forming a juncture portion of the first opening portion and the second opening portion shifted to one of the first-surface side and the second-surface side from a center portion of the metal layer in a thickness direction of the metal layer.

4. The method for manufacturing a multilayer printed wiring board according to claim 2, wherein the forming of the second penetrating hole comprises forming the second penetrating hole such that the metal layer is insulated from the through-hole conductor.

5. The method for manufacturing a multilayer printed wiring board according to claim 1, wherein the forming of the second penetrating hole comprising forming the first opening portion narrowing from the first surface of the core substrate toward the second surface of the core substrate and forming the second opening portion narrowing from the second surface of the core substrate toward the first surface of the core substrate.

6. The method for manufacturing a multilayer printed wiring board according to claim 5, wherein the forming of the second penetrating hole comprises forming the second penetrating hole such that the metal layer is insulated from the through-hole conductor.

7. The method for manufacturing a multilayer printed wiring board according to claim 1, wherein the metal layer forms a power-source conductor, and the through-hole conductor forms a signal conductor.

8. The method for manufacturing a multilayer printed wiring board according to claim 1, wherein the forming of the second penetrating hole comprises forming a juncture portion of the first opening portion and the second opening portion in the first penetrating hole.

9. The method for manufacturing a multilayer printed wiring board according to claim 1, wherein the forming of the second penetrating hole comprises forming a diameter of the second penetrating hole which is smallest at a juncture portion of the first opening portion and the second opening portion.

10. The method for manufacturing a multilayer printed wiring board according to claim 1, wherein each of the insulation layers comprises an inorganic fiber and a resin.

11. The method for manufacturing a multilayer printed wiring board according to claim 1, wherein the preparing of the core substrate comprises filling a resin in the first penetrating hole.

12. The method for manufacturing a multilayer printed wiring board according to claim 1, wherein the preparing of the core substrate comprises forming the inner wall of the first penetrating hole by etching such that the first penetrating hole has the diameter which becomes greater toward the center portion of the metal layer in the thickness direction of the metal layer.

13. The method for manufacturing a multilayer printed wiring board according to claim 1, further comprising:
    forming in one of the insulation layers on the first-surface side of the metal layer a third opening portion extending to the metal layer; and forming a first via conductor connecting the first conductor and the metal layer in the third opening portion.

14. The method for manufacturing a multilayer printed wiring board according to claim 13, wherein the forming of the third opening portion and the forming of the first opening portion are carried out consecutively.

15. The method for manufacturing a multilayer printed wiring board according to claim 1, further comprising:
   forming in one of the insulation layers on the second-surface side of the metal layer a fourth opening portion extending to the metal layer; and
   forming a second via conductor connecting the second conductor and the metal layer in the fourth opening portion.

16. The method for manufacturing a multilayer printed wiring board according to claim 15, wherein the forming of the fourth opening portion and the forming of the second opening portion are carried out consecutively.

17. The method for manufacturing a multilayer printed wiring board according to claim 1, wherein the forming of the first opening portion comprises forming an aperture diameter for forming the first opening portion which is smaller than an opening diameter of the first penetrating hole.

18. The method for manufacturing a multilayer printed wiring board according to claim 1, wherein the forming of the second opening portion comprises forming an aperture diameter for forming the second opening portion which is smaller than an opening diameter of the first penetrating hole.

19. The method for manufacturing a multilayer printed wiring board according to claim 1, wherein the forming of the second penetrating hole comprises forming the second penetrating hole such that the metal layer is insulated from the through-hole conductor.

20. The method for manufacturing a multilayer printed wiring board according to claim 1, wherein the filling of the conductive material comprises filling a plating material in the second penetrating hole such that the through-hole conductor comprising the plating material and connecting the first conductor and the second conductor is formed.

* * * * *